United States Patent
Sadjadpour et al.

(10) Patent No.: US 6,453,442 B1
(45) Date of Patent: Sep. 17, 2002

(54) TWO STAGE S_RANDOM INTERLEAVER

(75) Inventors: Hamid R. Sadjadpour, Florham Park, NJ (US); Masoud Salehi, Westwood, MA (US); Neil James Alexander Sloane, Highland Park, NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/378,281

(22) Filed: Aug. 20, 1999

(51) Int. Cl.$^7$ .............................................. H03M 13/03
(52) U.S. Cl. ...................... 714/787; 714/788; 714/701
(58) Field of Search ................................ 714/755, 757, 714/786, 792, 794, 701, 787, 788

(56) References Cited

U.S. PATENT DOCUMENTS 6,298,463 B1 * 10/2001 Bingeman et al. .......... 714/755

OTHER PUBLICATIONS

"Weight Distributions for Turbo Codes Using Random and Nonrandom Permutations," by S. Bendetto, D. Divsalar, G. Montorsi and F. Pollar, *TDA Report* p. 42–122, Aug. 15, 1995;.

"Combined Turbo Codes and Interleaver Design," by Yuan, B. Vucetic and W. Feng, *IEEE Trans. on Communication*, vol. 47, No. 4, Apr., 1999.

Hokfelt, O. Edfors, and T. Maseng, "Turbo Codes: Correlated Extrinsic Information and its Impact in Iterative Decoding Performance," Proceeding of IEEE VTC '99, Houston, Texas.

L. Bahl, J. Cocke, F. Jelinek, and J. Raviv, "Optimum decoding of linear codes for minimizing symbol error rate," IEEE Trans. On Inf. Theory, vol. IT–20, pp. 284–287, Mar. 1974.

J. Hokfelt, O. Edfors, and T. Maseng, "Interleaver Design for Turbo Codes Based on the Performance of Iterative Decoding," Proceeding of IEEE ICC '99, Vancouver, Canada.

"Design of Parallel Concatenated Convolutional Codes," IEEE Trans. On Comm., vol. 44 No. 5, pp. 591–600, May, 1996.

Yuan, Vucetic, and Feng: Combined turbo Codes and Interleaver Design, IEEE Transactions on Communications, vol. 47, No. 4, Apr. 1999.*

Hokfelt, Edfors, and Maseng: Turbo Codes: Correlated Extrinsic Information and its Impact on Iterative Decoding Performance, Proceeding of IEEE VTC '99, Houston, TX.*

* cited by examiner

*Primary Examiner*—Albert Decady
*Assistant Examiner*—Matt Dooley
(74) *Attorney, Agent, or Firm*—Banner & Witcoff, Ltd.

(57) ABSTRACT

The present invention provides a method, a computer medium, and a device for a two stage S_Random interleaver that is constructed based on two optimization criteria. The distance spectrum properties of the code are maximized by designing an interleaver that increases the minimum effective free distance of the code. In addition, the interleaver is designed to reduce the correlation properties of the extrinsic information that is fed into the next stage decoder. Thus, the present invention utilizes the reduced correlation properties to provide a more efficient S-random interleaver with increased iterations, thus maximizing the bit error rate (BER) performance of the code with respect to iterative decoding.

14 Claims, 5 Drawing Sheets

TWO STAGE S_RANDOM INTERLEAVER

FIELD OF THE INVENTION

The invention relates to Parallel (Turbo codes) or Serial Concatenated Convolutional codes. More specifically, the invention relates to interleavers for parallel or serial concatenated convolutional codes.

BACKGROUND OF THE INVENTION

Both parallel and serial concatenated convolutional codes are referred to herein as Turbo codes for simplicity. Several techniques for using interleaving for Turbo codes have been addressed in the prior art. A random interleaver is the most common interleaver design for Turbo codes. A random interleaver of length N selects random integers between 1 and N for a block of data of length N, i.e., the random interleaver is a permutation of N integers that, for each i, there is a corresponding random integer $\pi(i)$, without repetition. For large values of N, most random interleavers perform well. However, when the interleaver block size decreases, the performance of the Turbo codes degrades substantially up to a point that its BER performance is worse than the convolutional codes with similar computational complexity. Most random interleavers demonstrate an acceptable bit error rate (BER) performance; however, research has been conducted to design interleavers for Turbo codes that can outperform random interleavers.

One approach was introduced in "Weight Distributions for Turbo Codes Using Random and Nonrandom Permutations," by S. Benedetto, D. Divsalar, G. Montorsi and F. Pollara, *TDA Report* p. 42–122, Aug. 15, 1995, wherein the interleaver was called an S_random interleaver. In this approach, for each integer i, where $1 \leq i \leq N$, a random number is chosen between 1 and N that maps the i-th bit to a new location in the interleaver. When a value is chosen, the value is compared to the S previously selected integers. If the current selection is equal to any of S previous selections within a distance ±S, then the current selection is rejected. Any selected integer should be chosen only once in the interleaver. The process repeats until all N integers are selected in a random order. Computer simulation results have shown that if $S \leq \sqrt{N/2}$, then the process will converge. This interleaver design assures that the short cycle events are avoided. A short cycle event occurs when two bits are close to each other before and after interleaving. This approach was considered to provide the best interleaver for Turbo codes for a long time, especially for short block length interleavers.

Recently, a new approach was developed that is based on the S random interleaver, but that also attempts to maximize the minimum effective free distance of the code. The new approach, described in "Combined Turbo Codes and Interleaver Design," by J. Yuan, B. Vucetic and W. Feng, *IEEE Trans.on Communication*, Vol. 47, No. 4, April, 1999, not only selects the integers in the interleaver based on the S_random criteria, but also attempts to provide an interleaver with a minimum effective free distance that is larger than a preselected value.

A new interleaver design was recently proposed by J. Hokfelt, O. Edfors, and T. Maseng, "Turbo Codes: Correlated Extrinsic Information and its Impact on Iterative Decoding Performance," Proceeding of IEEE VTC '99, Houston, Tex., based on the performance of iterative decoding algorithm in Turbo codes. Turbo codes utilize an iterative decoding algorithm based on a MAP algorithm (described by L. Bahl, J. Cocke, F. Jelinek, and J. Raviv, "Optimum decoding of linear codes for minimizing symbol error rate," IEEE Trans. On Inf. Theory, vol. IT-20, pp. 284–287, Mar. 1974, and hereby incorporated by reference) or any algorithm that provides soft output. At each decoding step, some information related to the parity bits of one decoder is fed into the next decoder together with the systematic data sequence and the parity bits corresponding to that decoder, as is known by those skilled in the art of using turbo codes. The inputs to each decoder are input data sequence $d_k$, the parity bits $y^1_k$ or $y^2_k$, and the logarithm of likelihood ratio (LLR) associated with the parity bits from the other decoder ($W^1_k$ or $W^2_k$). All these inputs are utilized by the MAP decoder to create three outputs corresponding to the weighted versions of these inputs. The output $d_k$ of the first decoder represents the weighted version of the input data sequence $d_k$. Also, the input data sequence is fed into the second decoder after interleaving. The input to each decoder from the other decoder is used as a priori probability in the next decoding step. This information is more effective in the performance of the iterative decoding when it is less correlated to the input data sequence (or interleaved input data sequence). Thus, this criterion is used for designing the interleaver. For large block interleavers, most random interleavers provide a low correlation between $W^i_k$ and the input data sequence $d_k$. The correlation coefficient $r_{W_{k1}^1, d_{k2}}^1$ is defined as the correlation coefficient between $W^i_k$ and $d_{k2}$. J. Hokfelt, O. Edfors, and T. Maseng, "Turbo Codes: Correlated Extrinsic Information and its Impact on Iterative Decoding Performance," Proceeding of IEEE VTC '99, Houston, Tex., have shown that $r_{W_{k1}^1, d_{k2}}^1$ can be analytically approximated as $$\hat{r}_{W_{k_1}^1, d_{k_2}}^1 = \begin{cases} a \exp^{-c|k1-k2|} & \text{if } k1 \neq k2 \\ 0 & \text{if } k1 = k2 \end{cases} \quad (1)$$

where a and c are two constants that depend on the encoder feedback and feedforward polynomials. The correlation coefficient at the output of the second decoder is approximated as $$\hat{r}_{W^2, d}^2 = \tfrac{1}{2} \hat{r}_{W1, d}^1 P(I + \hat{r}_{W1, d}^1) \quad (2)$$

where the two terms on the right hand side of (2) correspond to the correlation coefficients between $W^2$ and the two input data, i.e., $W^1$ and d. Similar correlation coefficients can be computed regarding the de-interleaver. The correlation matrix corresponding to the de-interleaver $\hat{r}'^2_{W^2, d}$ is the same as (2), except P is substituted by Then $V_{k_1}$, which is the variance of the correlation coefficients, is defined as $$V_{k_1} = \frac{1}{N-1} \sum_{k_2=1}^{N} \left( \hat{r}_{W_{k_1}^2, d_{k_2}}^2 - \bar{\hat{r}}_{W, d_{k_2}}^2 \right)^2 \quad (3)$$

where $$\bar{\hat{r}}_{W, d_{k_2}}^2 = \frac{1}{N-1} \sum_{k_2=1}^{N} \hat{r}_{W_{k_1}^2, d_{k_2}}^2 \quad (4)$$

$V'_{k1}$ is defined similarly using $\hat{r}'^2_{W^2, d}$.

The iterative decoding suitability (IDS) measure is then defined as $$IDS = \frac{1}{2N} \sum_{k_1=1}^{N} \left( V_{k_1} + V'_{k_1} \right) \quad (5)$$

A low value of IDS is an indication that correlation properties between $W^1$ and d are equally spread along the data sequence of length N. An interleaver design based on the IDS condition is suggested by J. Hokfelt, O. Edfors, and T. Maseng, "Interleaver Design for Turbo Codes Based on the Performance of Iterative Decoding," Proceeding of IEEE ICC '99, Vancouver, Canada.

However, there is a need for a more efficient S_random interleaver.

SUMMARY OF THE INVENTION

The current invention is based on two optimization criteria using an S_random interleaver. The first criterion is to maximize the distance spectrum properties of the code by designing an interleaver that increases the minimum effective free distance of the code. The second criterion is to design the interleaver in a way to reduce the correlation properties of the extrinsic information that is fed into the next stage decoder. The present invention utilizes different techniques to achieve these two properties based on a S_random interleaver. This design maximizes the bit error rate (BER) performance of the code with respect to iterative decoding in Turbo codes.

BRIEF DESCRIPTIONS OF THE FIGURES

DETAILED DESCRIPTION OF PREFERRED EMBODIMENTS

Figure 1:
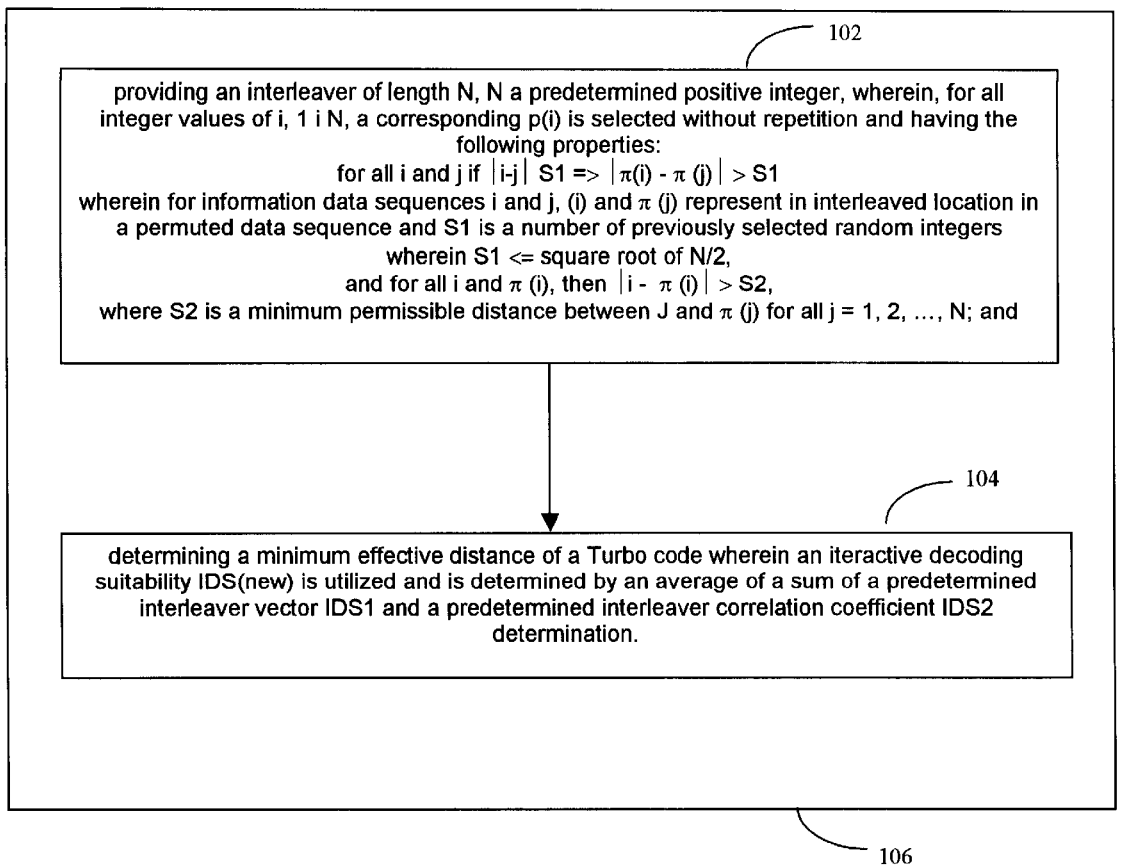
FIG. 1 is a flow chart showing one embodiment of steps in accordance with the method/computer medium of the present invention.

The present invention optimizes an S_random interleaver by implementing a two stage technique to develop effective interleaver values by increasing the minimum effective free distance of the Turbo code while decreasing the correlation properties between the information input data sequence or at least maintaining the correlation coefficients the same level of the first step of the design, $d_k$, and $W_k^i$. Hokfelt et al. (see two Hokfelt et al. references above) presented an IDS criterion to evaluate correlation properties. The two vectors that are used for the computation of IDS, namely, $V_{k1}$ and $V'_{k1}$, are very similar criteria and for most interleavers, it is sufficient to use only $V_{k1}$. However, the present invention utilizes another criterion, decreasing the correlation after the third decoding step, the correlation between the feedback extrinsic information from the second decoder and the input information data sequence. In this regard, the new $\hat{r}'_{W^2,d}{}^2$ is defined as:

$$\hat{r}'^2_{W^2,d} = \frac{1}{2} \hat{r}^2_{W^2,d} P^T \left( I + \hat{r}^2_{W^2,d} \right) \quad (6)$$

$$= \frac{1}{4} \left( \hat{r}^1_{W^1,d} + \hat{r}^1_{W^1,d} P \hat{r}^1_{W^1,d} P^T \right) \times$$

$$\left( I + 0.5 \times \hat{r}^1_{W^1,d} P + 0.5 \times \hat{r}^1_{W^1,d} P \hat{r}^1_{W^1,d} \right)$$

$V'_{k_1}{}^{(new)}$ can now be defined similar to (3) based on (6). The new iterative decoding suitability (IDS$_1$) is then defined as:

$$IDS_1 = \frac{1}{2N} \sum_{k_1=1}^{N} \left( V_{k_1} + V'^{(new)}_{k_1} \right) \quad (7)$$

A small value for IDS$_1$ guarantees that the correlation properties are spread equally throughout the information input data sequence. However, this criterion does not attempt to reduce the power of correlation coefficients, i.e., $(\hat{r}_{W_{k_1}^2,d_{k_2}}^2)^2$, $(\hat{r}'_{W_{k_1}^2,d_{k_2}}^2)^2$. Therefore, the present invention further adds the criterion set forth below to the iterative decoding suitability:

$$IDS_2 = \frac{1}{2N^2} \sum_{k_1=1}^{N} \sum_{k_2=1}^{N} \left( (\hat{r}^2_{W^2_{k_1},d_{k_2}})^2 + (\hat{r}'^2_{W^2_{k_1},d_{k_2}})^2 \right) \quad (8)$$

Where a more simplified approach is desired, the new IDS (IDS$_{(new)}$) criterion may be based on IDS$_1$ and IDS$_2$ by averaging on IDS$_1$ and IDS$_2$:

$$IDS_{(new)} = \frac{1}{2}(IDS_1 + IDS_2) \quad (9)$$

However, averaging IDS$_1$ and IDS$_2$ alone may not be optimum. Thus, in the present invention equation (9) is used as one of the conditions for optimization of the interleaver.

Terminology and parameters that are used herein include: the length of Turbo block or interleaver is N; also, the mapping of each data value i to a new permuted location is done through a function that is defined as $\pi(i)$. Therefore, each data value i is mapped to a new location with the value of $\pi(i)$. The weight of a codeword consists of the total weight of the input data sequence of length N and the weight of the output of the first and second encoder. The minimum weight of the codeword based on all possible input data sequences is called the minimum effective free distance, $d_{min,eff}$.

Use of an S-interleaver avoids short cycle events, guaranteeing that two bits close to each other before interleaving will have a minimum distance of S after interleaving. More precisely, for information data sequences i and j, $\pi(i)$ and $\pi(j)$ represent their interleaved location in the permuted data sequence. The S-random interleaver guarantees that if $|i-j| \leq S$, then $|\pi(i)-\pi(j)| > S$. In the extreme case, if $\pi(j)=j$ and the above condition is satisfied, $j \to \pi(j)$ is a valid assignment for the S-random interleaver. However, this may degrade the performance of the iterative decoding of the Turbo codes. The larger the distance between j and $\pi(j)$, the smaller the correlation between the extrinsic information from the second decoder and the input information data sequence. Based on the above, the present invention provides an additional constraint, S$_2$, which is defined as the minimum permissible distance between j and $\pi(j)$ for all j=1, 2, . . . , N.

Unlike the interleaver design based on the IDS condition suggested by J. Hokfelt, O. Edfors, and T. Maseng, "Interleaver Design for Turbo Codes Based on the Performance of Iterative Decoding," Proceeding of IEEE ICC '99, Vancouver, Canada, the present invention provides an interleaver with two stages: in the first stage, the S-random criterion and the $S_2$ are satisfied; and in the second stage, the minimum effective free distance of the Turbo code is determined using the $IDS_{(new)}$ condition.

FIG. 1 is a flow chart showing one embodiment of steps in accordance with the method of the present invention. In one embodiment, the steps of the method may be computer-executable instructions stored on a computer medium (106). The steps are as follows:

Step #1: Design an interleaver of length N that, for all integer values of i, a corresponding $\pi(i)$ is selected without repetition and having the following properties (102):

(1) For all i and j if $|i-j| \leq S_1 \rightarrow |\pi(i)-\pi(j)| > S_1$.

(2) For all i and $\pi(i)$ then $|i|\pi(i)| > S_2$.

Thus, a random integer i, where $I \leq i \leq N$, is chosen without replacement. Each randomly selected integer is compared to the $S_1$ previously selected integers. If the current selection is within $\pm S_1$ previous selected integers, then this selection is rejected. Otherwise, this integer number is selected if the following relationship to $S_2$ is also satisfied:

Then, an integer $\pi(i)$ corresponding to each i is selected based on $S_2$ such that:

$$|i-\pi(i)| \geq S_2$$

where $S_2$ is selected by experiment and is typically less than $\sqrt{N/2}$.

Step #2: Determine (104) the minimum effective free distance of the Turbo code as described by S. Benedetto and G. Montorsi, "Design of Parallel Concatenated Convolutional Codes," IEEE Trans. On Comm., vol. 44, no. 5, pp. 591–600, May 1996, using the $IDS_{(new)}$ condition. First, select a predetermined effective free distance $d_{min1}$. Find all input data sequences of length N and weight $w_{det}$ where $w_{det}$ is a predetermined input weight data sequence and with the minimum effective free distance $d_{min} < d_{min1}$. For an input data sequence of length N and weight $w_1$, the interleaver has the following non-zero interleaver pairs: $(i_1, \pi(i_1))$, $(i_2, \pi(i_2))$, . . . , $(i_{w1}, \pi(i_{w1}))$ with $d_{min,w1} < d_{min1}$. Compute $IDS_{(new)}$ for this interleaver where $IDS_{(new)} = \frac{1}{2}(IDS_1 + IDS_2)$. Set $j = i_1 + 1$ and find a pair $(j, \pi(j))$. Interchange the interleaver pairs $(i_1, \pi(i_1))$ and $(j, \pi(j))$ to create a new interleaver, i.e., $(i_1, \pi(j))$, $(j, \pi(i_1))$. Compute the new IDS, $IDS'_{(new)}$, based on the new interleaver design. If $IDS'_{(new)} \leq IDS_{(new)}$, the new interleaver design will replace the previous one. This means that the particular input data sequence of weight $w_1$ will no longer create a minimum effective free distance of $d_{min,w1}$ after changing the interleaver structure. Otherwise, set $j = j+1$ and continue the search until a new interleaver with a smaller or equal $IDS'_{(new)}$ is found. Repeat this operation for all input data sequences that have $d_{min} < d_{min1}$. After the search is completed, go back to step 2 again and find all input data sequences of weight $w_{det}$ or less with $d_{min} < d_{min1}$. Clearly, if a large value is selected for $d_{min1}$, the second step may never converge. In this case, a smaller value for $d_{min1}$ is to be selected. This procedure if it converges, will guarantee that the final interleaver design will make all codewords in the Turbo code have a minimum effective free distance of $d_{min1}$.

The feedback polynomial for each recursive systematic convolutional code in an encoder in the present invention is selected to be a primitive polynomial since primitive polynomials used for Turbo codes exhibit better spectrum distance properties.

Figure 2:
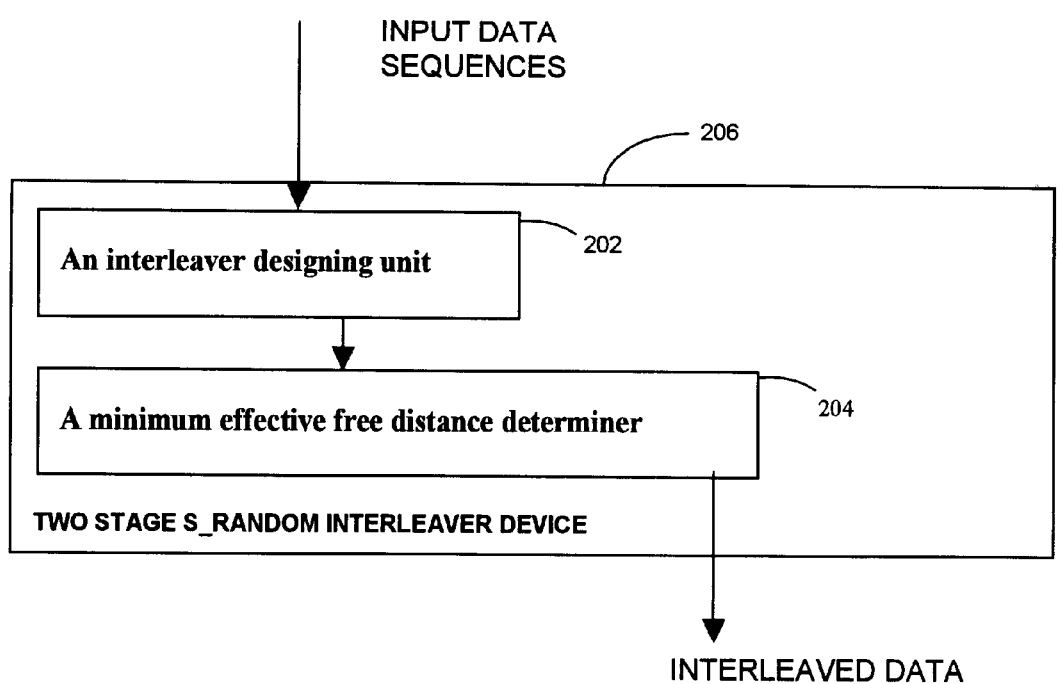
FIG. 2 is a block diagram of one embodiment of a device in accordance with the present invention.

FIG. 2 is a block diagram of one embodiment of a device (206) in accordance with the present invention. The device includes an interleaver designing unit (202) for providing an interleaver of length N wherein, for all integer values of i, a corresponding $\pi(i)$ is selected without repetition and having the following properties:

(1) For all i and j if $|i-j| \leq S_1 \rightarrow |\pi(i)-\pi(j)| > S_1$.

(2) For all i and $\pi(i)$ then $|i-\pi(i)| > S_2$.

The interleaver designing unit (202) may be implemented by a processor, firmware or by a unit of computer-executable instructions stored in a computer medium.

The device further includes a minimum effective free distance determiner (204), coupled to the interleaver designing unit (202), for determining the minimum effective free distance of the Turbo code using the $IDS_{(new)}$ condition, as described more fully above. The minimum effective free distance determiner (204) may be implemented by a processor, firmware or by a unit of computer-executable instructions stored in a computer medium.

Other design criteria that can reduce the search in a significant way and are applied in the interleaver design is as follows. The last data sequence in each block is determined as the exclusive or of all the previous N–1 data sequence in the block. In this case, each block of data sequence of length N has only even number of ones in the block. That means all the input odd data sequence in the search are basically avoided with this simple addition of redundancy at the end of block. Also, $\pi(1) = N$. That means the last bit in the data sequence of length N will be the first bit in the interleaved version of data sequence.

Figure 3:
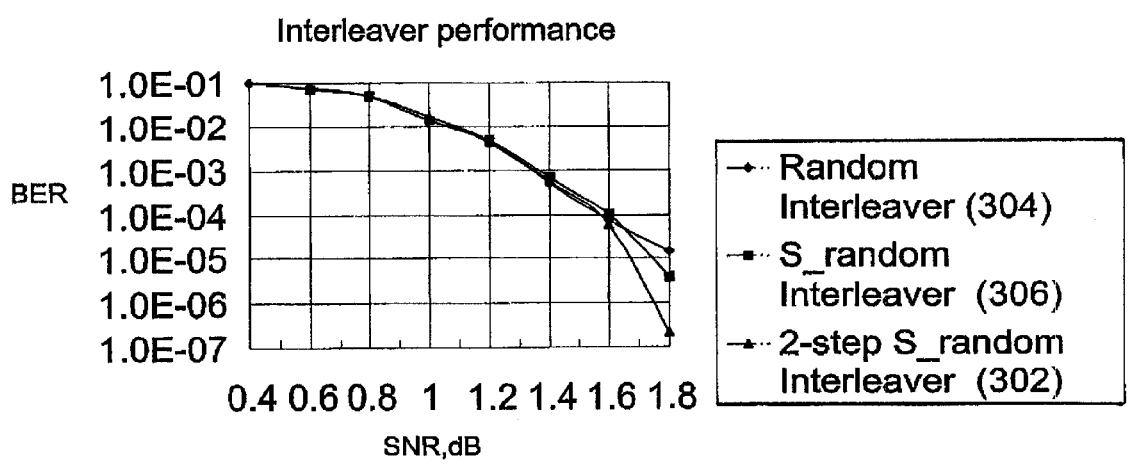
FIG. 3 is a graphical representation of a comparison of the performance of a new optimal interleaver (2-stage S-random interleaver) in accordance with the present invention, a random interleaver and the best existing interleaver (S_random interleaver).

FIG. 3 is a graphical representation of a comparison of the performance of a new optimal interleaver (2 step S-random interleaver) (302) in accordance with the present invention, a random interleaver (304) and the best existing interleaver (S_random interleaver) (306). As may be seen from the graph, the interleaver system of the present invention has superior performance.

Figure 4:
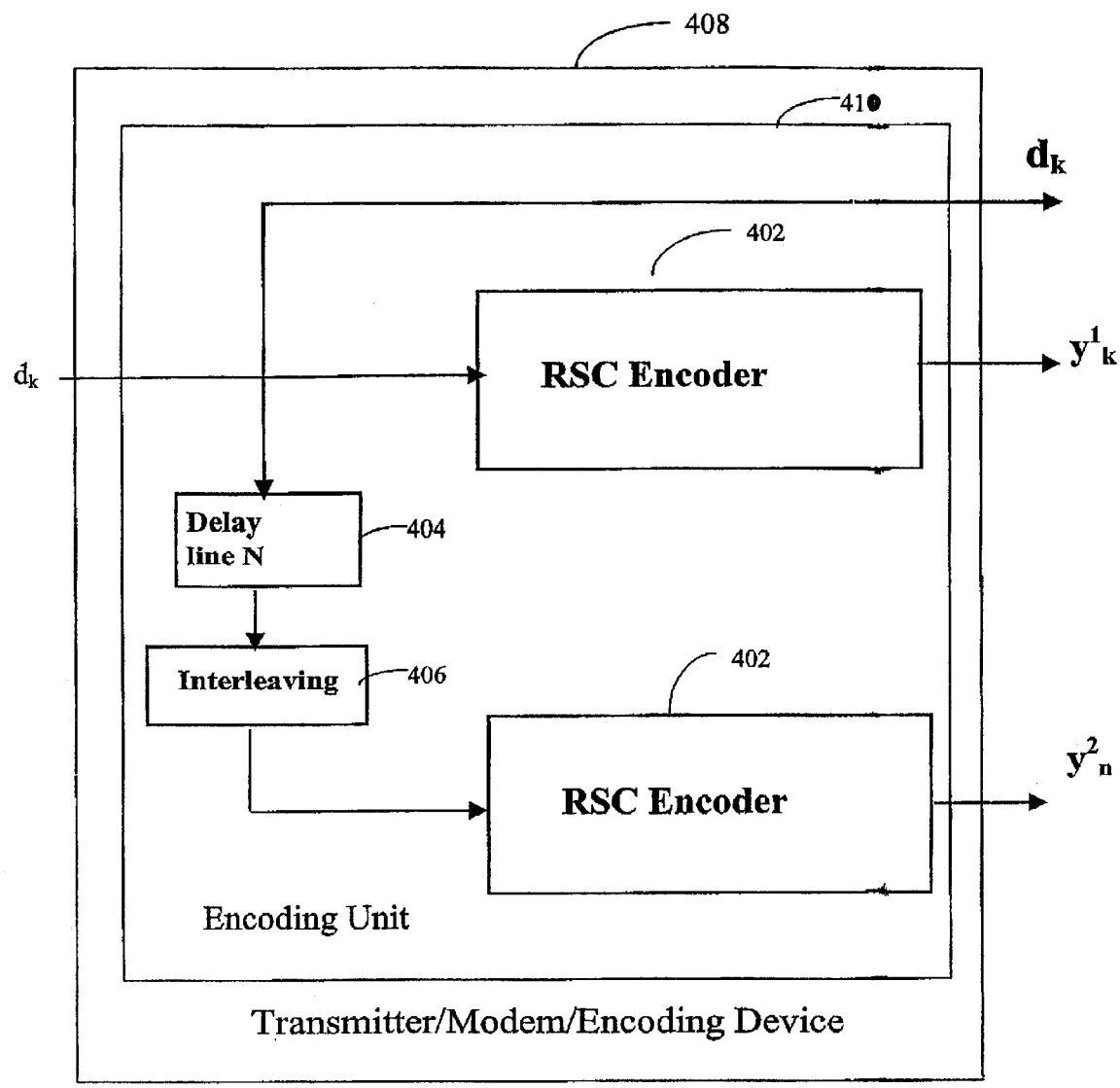
FIG. 4 is a block diagram of one embodiment of Turbo encoder hardware in accordance with the present invention.

FIG. 4 is a block diagram of one embodiment of Turbo encoder hardware in accordance with the present invention. The input data sequence $d_k$ is input into a first recursive systematic convolutional (RSC) encoder (402), yielding output $y_k^1$. In addition, $d_k$ is input into a predetermined delay line N (404), and the output of the predetermined delay line N (404) is input into an interleaving unit (406), that interleaves $d_k$ in accordance with the invention as described above. The output of the interleaving unit (406) is input into a second RSC encoder (402), yielding output $y_n^2$. The outputs $y_k^1$ and $y_n^2$ are the parity bits that are input into the decoder at the receiver. Typically, the Turbo encoder hardware of FIG. 4 is implemented in a transmitter, modem or encoding device (408) having an encoding unit (410) that includes the RSC encoders (402), the predetermined delay line N (404), and interleaving unit (406) as described above.

Figure 5:
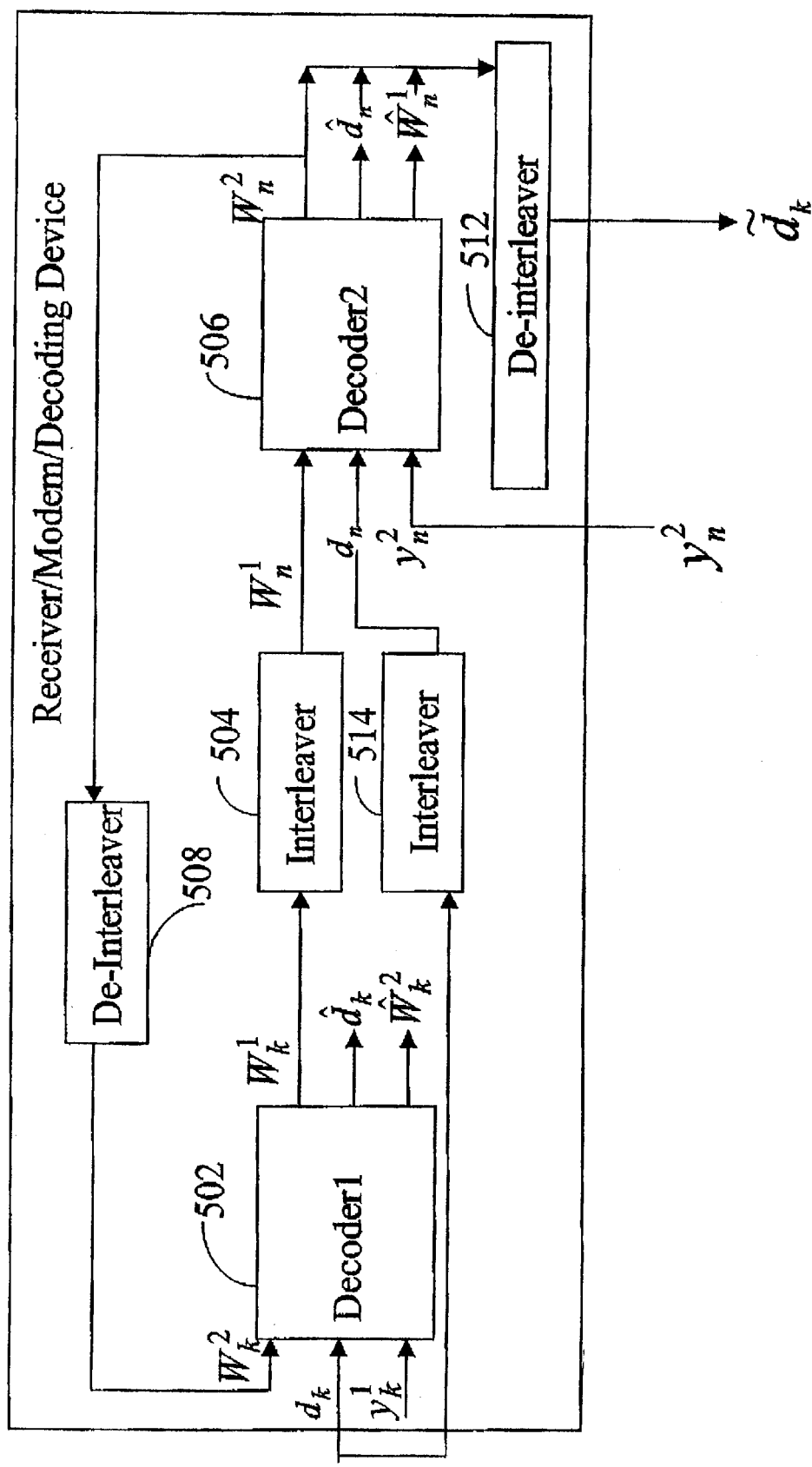
FIG. 5 is a block diagram of one embodiment of Turbo decoder hardware in accordance with the present invention.

FIG. 5 is a block diagram of one embodiment of Turbo decoder hardware in accordance with the present invention. The received $d_k$ and $y_k^1$ are input into Decoder1 (502), that outputs $W_k^1$ into an interleaver (504), which outputs $W_n^1$. In addition, the received $d_k$ is input into an interleaver (514) to provide interleaved $d_n$. $W_n^1$ and $d_n$ are input into Decoder2 (506), which outputs $W_n^2, \hat{d}_n$, and $\hat{W}_n^1$. Output $W_n^2$ is input to the feedback De-interleaver (508) and to the receiver/modem/decoding device de-interleaver (512). In addition, $\hat{d}_n$, and $\hat{W}_n^1$ are input to the receiver/modem/decoding device de-interleaver (512). The feedback De-interleaver (508) outputs $W_k^2$ to Decoder1 (502). The receiver/modem/decoding device de-interleaver (512) outputs an approximation of $d_k, \hat{d}_k$. All calculations are in accordance with the equations set forth above.

Although the present invention has been described in relation to particular preferred embodiments thereof, many variations, equivalents, modifications and other uses will become apparent to those skilled in the art. It is preferred, therefore, that the present invention be limited not by the specific disclosure herein, but only by the appended claims.

What is claimed is:

1. A method for providing an efficient 2-step S_Random interleaver, comprising the steps of:

providing an interleaver of length N, N a predetermined positive integer, wherein, for all integer values of i, $1 \leq i \leq N$, a corresponding $\pi(i)$ is selected without repetition and having the following properties:

for all i and j if $|i-j| \leq S_1 \rightarrow |\pi(i)-\pi(j)| > S_1$, wherein for information data sequences i and j, $\pi(i)$ and $\pi(j)$ represent an interleaved location in a permuted data sequence and $S_1$ is a number of previously selected random integers wherein $S_1 \leq \sqrt{N/2}$, and for all i and $\pi(i)$, then $|i-\pi(i)| > S_2$, where $S_2$ is a minimum permissible distance between j and $\pi(j)$ for all j=1,2, ..., N; and determining a minimum effective free distance of a Turbo code wherein an iterative decoding suitability $IDS_{(new)}$ is utilized and is determined by an average of a sum of a predetermined interleaver vector $IDS_1$ and a predetermined interleaver correlation coefficient $IDS_2$ determination.

2. The method of claim 1 wherein:

$$IDS_{(new)} = \tfrac{1}{2}(IDS_1 + IDS_2)$$

wherein $$IDS_1 = \frac{1}{2N} \sum_{k_1=1}^{N} \left( V_{k_1} + V'^{(new)}_{k_1} \right) \quad \text{and}$$

$$IDS_2 = \frac{1}{2N^2} \sum_{k_1=1}^{N} \sum_{k_2=1}^{N} \left( (\hat{r}^2_{w^2_{k_1}, d_{k_2}})^2 + (\hat{r}'^2_{w^2_{k_1}, d_{k_2}})^2 \right).$$

3. The method of claim 1 wherein determining a minimum effective free distance of a Turbo code includes:

selecting a predetermined effective free distance $d_{min1}$, finding all input data sequences of length N and weight $w_{det}$ that is a predetermined value such that $d_{min} < d_{min1}$ where $d_{min1}$ is also predetermined;

selecting interleaver pairs for an input data sequence of length N and weight $w_1 < w_{det}$, wherein the non-zero interleaver pairs include: $(i_1, \pi(i_1)), (i_2, \pi(i_2)), \ldots, (i_{w1}, \pi(i_{w1}))$ with $d_{min,w1} < d_{min1}$;

computing $IDS_{(new)}$ where $IDS_{(new)} = \tfrac{1}{2}(IDS_1 + IDS_2)$;

setting $j = i_1 + 1$ and finding a pair $(j, \pi(j))$;

interchanging interleaver pairs $(i_1, \pi(i_1))$ and $(j, \pi(j))$ to create a new interleaver;

computing a new IDS, $IDS'_{(new)}$, based on the new interleaver design, wherein, if $IDS'_{(new)} \leq IDS_{(new)}$, a new interleaver design replaces a previous interleaver, and otherwise, setting $j = j + 1$ and continuing searching until a new interleaver with a smaller $IDS'_{(new)}$ is found;

repeating determining a minimum effective free distance for all input data sequences that have $d_{min} < d_{min1}$; and upon completion of determining a minimum effective free distance for all said input data sequences, finding all input data sequences of weight $w_{det}$ or less with $d_{min} < d_{min1}$, selecting a smaller value for $d_{min1}$ if necessary for convergence.

4. A computer-storage medium having computer-executable instructions stored thereon for providing an efficient S_Random interleaver, wherein the computer-executable instructions include the steps of:

providing an interleaver of length N, N a predetermined positive integer, wherein, for all integer values of i, $1 \leq i \leq N$, a corresponding $\pi(i)$ is selected without repetition and having the following properties:

for all i and j if $|i-j| \leq S_1 \rightarrow |\pi(i)-\pi(j)| > S_1$, wherein for information data sequences i and j, $\pi(i)$ and $\pi(j)$ represent an interleaved location in a permuted data sequence and $S_1$ is a number of previously selected random integers wherein $S_1 \leq \sqrt{N/2}$, and for all i and $\pi(i)$, then $|i-\pi(i)| > S_2$, where $S_2$ is a minimum permissible distance between j and $\pi(j)$ for all j=1,2, ..., N; and determining a minimum effective free distance of a Turbo code wherein an iterative decoding suitability $IDS_{(new)}$ is utilized and is determined by an average of a sum of a predetermined interleaver vector $IDS_1$ and a predetermined interleaver correlation coefficient $IDS_2$ determination.

5. The computer-readable medium of claim 4 wherein:

$$IDS_{(new)} = \tfrac{1}{2}(IDS_1 + IDS_2)$$

wherein $$IDS_1 = \frac{1}{2N} \sum_{k_1=1}^{N} \left( V_{k_1} + V'^{(new)}_{k_1} \right) \quad \text{and}$$

$$IDS_2 = \frac{1}{2N^2} \sum_{k_1=1}^{N} \sum_{k_2=1}^{N} \left( (\hat{r}^2_{w^2_{k_1}, d_{k_2}})^2 + (\hat{r}'^2_{w^2_{k_1}, d_{k_2}})^2 \right).$$

6. The computer-readable medium of claim 4 wherein determining a minimum effective free distance of a Turbo code includes:

selecting a predetermined effective free distance $d_{min1}$, finding all input data sequences of length N and weight $w_{det}$ such that $d_{min} < d_{min1}$;

selecting interleaver pairs for an input data sequence of length N and weight $w_1$, wherein the non-zero interleaver pairs include: $(i_1, \pi(i_1)), (i_2, \pi(i_2)), \ldots, (i_{w1}, \pi(i_{w1}))$ with $d_{min,w1} < d_{min1}$;

computing $IDS_{(new)}$ where $IDS_{(new)} = \tfrac{1}{2}(IDS_1 + IDS_2)$;

setting $j = i_1 + 1$ and finding a pair $(j, \pi(j))$;

interchanging interleaver pairs $(i_1, \pi(i_1))$ and $(j, \pi(j))$ to create a new interleaver;

computing a new IDS, $IDS'_{(new)}$, based on the new interleaver design, wherein, if $IDS'_{(new)} \leq IDS_{(new)}$, a new interleaver design replaces a previous interleaver, and otherwise, setting $j = j + 1$ and continuing searching until a new interleaver with a smaller $IDS'_{(new)}$ is found;

repeating determining a minimum effective free distance for all input data sequences that have $d_{min} < d_{min1}$; and upon completion of determining a minimum effective free distance for all said input data sequences, finding all input data sequences of weight $w_{det}$ or less with $d_{min} < d_{min1}$, selecting a smaller value for $d_{min1}$ if necessary for convergence.

7. A device for providing a two stage S_Random interleaver, comprising:

an interleaver designing unit for providing an interleaver of length N that, for all integer values of i, a corresponding $\pi(i)$ is selected without repetition and having the following properties:

for all i and j if $|i-j| \leq S_1 \to |\pi(i)-\pi(j)| > S_1$; wherein for information data sequences i and j, $\pi(i)$ and $\pi(j)$ represent an interleaved location in a permuted data sequence and $S_1$ is a number of previously selected random integers wherein usually $S_1 \leq \sqrt{N/2}$, and for all i and $\pi(i)$, then $|i-\pi(i)| > S_2$, where $S_2$ is a minimum permissible distance between j and $\pi(j)$ for all j=1, 2, ..., N;

a minimum effective free distance determiner, coupled to the interleaver designing unit, for determining the minimum effective free distance of the Turbo code using an iterative decoding suitability $IDS_{(new)}$ that is determined by an average of a sum of a predetermined interleaver vector $IDS_1$ and a predetermined interleaver correlation coefficient $IDS_2$ determination.

8. The device of claim 7 wherein:

$$IDS_{(new)} = \frac{1}{2}(IDS_1 + IDS_2)$$

wherein $$IDS_1 = \frac{1}{2N} \sum_{k_1=1}^{N} \left( V_{k_1} + V'^{(new)}_{k_1} \right) \quad \text{and}$$

$$IDS_2 = \frac{1}{2N^2} \sum_{k_1=1}^{N} \sum_{k_2=1}^{N} \left( (\hat{r}^2_{w^2_{k_1},d_{k_2}})^2 + (\hat{r}'^2_{w^2_{k_1},d_{k_2}})^2 \right).$$

9. The device of claim 7 wherein the minimum effective free distance determiner determines a minimum effective free distance of a Turbo code by:

selecting a predetermined effective free distance $d_{min1}$, finding all input data sequences of length N and weight $w_{det}$ such that $d_{min} < d_{min1}$;

selecting interleaver pairs for an input data sequence of length N and weight $w_1$, wherein the non-zero interleaver pairs include: $(i_1, \pi(i_1)), (i_2, \pi(i_2)), \ldots, (i_{w1}, \pi(i_{w1}))$ with $d_{min,w1} < d_{min1}$;

computing $IDS_{(new)}$ where $IDS_{(new)} = \frac{1}{2}(IDS_1 + IDS_2)$;

setting $j = i_1 + 1$ and finding a pair $(j, \pi(j))$;

interchanging interleaver pairs $(i_1, \pi(i_1))$ and $(j, \pi(j))$ to create a new interleaver;

computing a new IDS, $IDS'_{(new)}$, based on the new interleaver design, wherein, if $IDS'_{(new)} \leq IDS_{(new)}$, a new interleaver design replaces a previous interleaver, and otherwise, setting $j = j + 1$ and continuing searching until a new interleaver with a smaller $IDS'_{(new)}$ is found;

repeating determining a minimum effective free distance for all input data sequences that have $d_{min} < d_{min1}$; and upon completion of determining a minimum effective free distance for all said input data sequences, finding all input data sequences of weight $w_{det}$ or less with $d_{min} < d_{min1}$, selecting a smaller value for $d_{min1}$ if necessary for convergence.

10. A transmitter/modem/encoding device having an encoding unit with a two-stage S_random interleaver, wherein the encoding unit comprises:

a first recursive systematic convolutional RSC encoder, coupled to receive an input data sequence $d_k$, for encoding $d_k$ in accordance with a predetermined scheme to provide an encoded output $y_k^1$;

a delay line N unit, coupled to receive $d_k$, for providing an output with a predetermined delay;

an interleaving unit, coupled to receive the output of the delay line N unit, for providing an interleaver of length N that, for all integer values of i, a corresponding $\pi(i)$ is selected without repetition and having the following properties:

for all i and j if $|i-j| \leq S_1 \to |\pi(i)-\pi(j)| > S_1$; wherein for information data sequences i and j, $i(i)$ and $\pi(j)$ represent an interleaved location in a permuted data sequence and $S_1$ is a number of previously selected random integers wherein usually $S_1 \leq \sqrt{N/2}$, and for all i and $\pi(i)$, then $|i-\pi(i)| > S_2$, where $S_2$ is a minimum permissible distance between j and $\pi(j)$ for all j=1, 2, ..., N;

and for determining the minimum effective free distance of the Turbo code using an iterative decoding suitability $IDS_{(new)}$ that is determined by an average of a sum of a predetermined interleaver vector $IDS_1$ and a predetermined interleaver correlation coefficient $IDS_2$ determination; and a second RSC encoder, coupled to the interleaving unit, for encoding an output of the interleaving unit in accordance with a predetermined scheme to provide an encoded output $y_n^2$.

11. The transmitter/modem/encoding device of claim 10 wherein:

$$IDS_{(new)} = \frac{1}{2}(IDS_1 + IDS_2)$$

wherein $$IDS_1 = \frac{1}{2N} \sum_{k_1=1}^{N} \left( V_{k_1} + V'^{(new)}_{k_1} \right) \text{ and}$$

$$IDS_2 = \frac{1}{2N^2} \sum_{k_1=1}^{N} \sum_{k_2=1}^{N} \left( (\hat{r}^2_{w^2_{k_1},d_{k_2}})^2 + (\hat{r}'^2_{w^2_{k_1},d_{k_2}})^2 \right).$$

12. The transmitter/modem/encoding device of claim 10 wherein the minimum effective free distance of the Turbo code is determined by:

selecting a predetermined effective free distance $d_{min}$, finding all input data sequences of length N and weight $w_{det}$ such that $d_{min} < d_{min1}$;

selecting interleaver pairs for an input data sequence of length N and weight $w_1$, wherein the non-zero interleaver pairs include: $(i_1, \pi(i_1)), (i_2, \pi(i_2)), \ldots, (i_{w1}, \pi(i_{w1}))$ with $d_{min,w1} < d_{min1}$;

computing $IDS_{(new)}$ where $IDS_{(new)} = \frac{1}{2}(IDS_1 + IDS_2)$;

setting $j = i_1 + 1$ and finding a pair $(j, \pi(j))$;

interchanging interleaver pairs $(i_1, \pi(i_1))$ and $(j, \pi(j))$ to create a new interleaver;

computing a new IDS, $IDS'_{(new)}$, based on the new interleaver design, wherein, if $IDS'_{(new)} \leq IDS_{(new)}$, a new interleaver design replaces a previous interleaver, and otherwise, setting $j = j + 1$ and continuing searching until a new interleaver with a smaller $IDS'_{(new)}$ is found;

repeating determining a minimum effective free distance for all input data sequences that have $d_{min} < d_{min1}$; and upon completion of determining a minimum effective free distance for all said input data sequences, finding all input data sequences of weight $w_{det}$ or less with $d_{min} < d_{min1}$, selecting a smaller value for $d_{min1}$ if necessary for convergence.

13. A receiver/modem/decoding device having a de-interleaving system for de-interleaving a received data sequence $d_k$ using a received, encoded parity bit $y_k^1$ and a received, interleaved, encoded parity bit $y_n^2$ that was interleaved by a two-stage S_random interleaver, comprising:

a first decoder, coupled to receive a data sequence $d_k$ and $y_k^1$, and to receive a de-interleaved feedback $W_k^2$, for decoding $d_k$ to provide a logarithm $W_k^1$ of likelihood ratio LLR associated with $y_k^1$ in accordance with a predetermined scheme;

an interleaver, coupled to the first decoder, for interleaving $W_k^1$ in accordance with a predetermined scheme to provide $W_n^1$;

a second interleaver, coupled to receive $d_k$, for interleaving $d_k$ to provide $d_n$;

a second decoder, coupled to receive $W_n^1, d_n$, and $y_n^2$, for decoding $W_n^1$ to provide $W_n^2$, decoding $d_n$ to provide $\hat{d}_n$, and decoding $W_n^1$ to provide $\hat{W}_n^1$ in accordance with predetermined schemes;

a feedback interleaver, coupled to the second decoder, for deinterleaving $W_n^2$ to provide the deinterleaved feedback $W_k^2$ to the first decoder;

a de-interleaver, coupled to receive $W_n^2; \hat{d}_n$ and $\hat{W}_n^1$, for de-interleaving $W_n^2; \hat{d}_n$ and $\hat{W}_n^1$ to provide an approximated $d_k$, $\tilde{d}_k$ in accordance with a predetermined scheme.

14. A method for providing an efficient 2-step S_Random interleaver, comprising the steps of:

providing a turbo code including an interleaver of length N; and determining a minimum effective free distance of the turbo code wherein an interative decoding suitability $IDS_{(new)}$ is utilized and is determined by an average of a sum of a predetermined interleaver vector $IDS_1$ and a predetermined interleaver correlation coefficient $IDS_2$ determination, wherein $IDS_{(new)} = (\frac{1}{2})(IDS_1 + IDS_2)$, wherein $$IDS_1 = \frac{1}{2N} \sum_{k_1}^{N} \left( V_{k_1} + V_{k_1}'^{(new)} \right),$$

and wherein $$IDS_2 = \frac{1}{2N^2} \sum_{k_1=1}^{N} \sum_{k_2=1}^{N} \left( (\hat{r}_{W_{k_1}^2, d_{k_2}}^2)^2 + (\hat{r}_{W_{k_1}^2, d_{k_2}}'^2)^2 \right).$$

* * * * *